United States Patent
Cok et al.

(10) Patent No.: US 7,816,856 B2
(45) Date of Patent: Oct. 19, 2010

(54) FLEXIBLE OLED DISPLAY WITH CHIPLETS

(75) Inventors: Ronald S. Cok, Rochester, NY (US); John W. Hamer, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 88 days.

(21) Appl. No.: 12/392,524

(22) Filed: Feb. 25, 2009

(65) Prior Publication Data

US 2010/0213819 A1    Aug. 26, 2010

(51) Int. Cl.
*H05B 33/00* (2006.01)
(52) U.S. Cl. ................ 313/503; 313/506; 313/512
(58) Field of Classification Search ............ None
See application file for complete search history.

(56) References Cited

U.S. PATENT DOCUMENTS

| | | | |
|---|---|---|---|
| 6,384,529 B2 | 5/2002 | Tang et al. | |
| 6,720,203 B2 * | 4/2004 | Carcia et al. | 438/99 |
| 6,819,316 B2 | 11/2004 | Schulz et al. | |
| 2006/0055854 A1 | 3/2006 | Yu et al. | |
| 2006/0132461 A1 | 6/2006 | Furukawa et al. | 345/173 |
| 2008/0085401 A1 | 4/2008 | Garner et al. | |
| 2009/0212690 A1 * | 8/2009 | Bruton et al. | 313/504 |
| 2009/0302756 A1 * | 12/2009 | Murayama et al. | 313/505 |

OTHER PUBLICATIONS

"Theoretical and Experimental Studies of Bending of Inorganic Electronic Materials on Plastic Substrates" in Advanced Functional Materials 2008, 18, 2673-2684 by Park et al.
Stretchable and Foldable Silicon Integrated Circuits, Dae-Hyeong Kim, et al Sicence, vol. 320, Apr. 25, 2008, pp. 507-511, plus supplemental online materials (www.sciencemag.org/cgi/content/full/1154367/dci.

* cited by examiner

*Primary Examiner*—Ashok Patel
(74) *Attorney, Agent, or Firm*—Morgan Lewis & Bockius LLP

(57) ABSTRACT

A flexible emissive display device having an adhesion layer thinner than the device substrate; a plurality of chiplets adhered to the adhesion layer wherein at least a portion of the adhesion layer extends above a portion of the chiplets; an OLED formed over the adhesion layer and wherein the OLED is thinner than the adhesion layer; a cover thicker than the adhesion layer located over the OLED and adhered to the device substrate; and wherein the chiplets and OLED are at or near the neutral stress plane of the device and the bending radius of the device is less than 2 cm.

20 Claims, 2 Drawing Sheets

FLEXIBLE OLED DISPLAY WITH CHIPLETS

FIELD OF THE INVENTION

The present invention relates to a flexible light-emitting display device employing independent control elements having separate substrates distributed over the device substrate

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored, light-emitting elements commonly referred to as sub-pixels, typically emitting red, green, and blue light, to represent each image element. A variety of flat-panel display technologies are known, for example plasma displays, liquid crystal displays, and light-emitting diode displays.

Light emitting diodes (LEDs) incorporating thin films of light-emitting materials forming light-emitting elements have, many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, charge transport, or charge blocking to the light-emitting-thin-film materials, and are known in the art. The materials are placed upon a substrate between electrodes, with an encapsulating cover layer or plate. Light is emitted from a sub-pixel when current passes through the light-emitting material. The frequency of the emitted light is dependent on the nature of the material used. In such a display, light can be emitted through the substrate (a bottom emitter) or through the encapsulating cover (a top emitter), or both.

In order for light to be emitted from an LED device, at least one electrode is transparent. Transparent electrodes are typically formed from transparent conductive oxides such as indium tin oxide (ITO). However, transparent conductive oxides are especially problematic for flexible devices since they are brittle and subject to cracking when stressed. The cracking reduces the conductivity of the electrode and can degrade the light-emitting materials.

Two different methods for controlling the pixels in a flat-panel display device are generally known: active-matrix control and passive-matrix control. In an active-matrix device, control elements are distributed over the flat-panel substrate. Typically, each sub-pixel is controlled by one control element and each control element includes at least one transistor. For example, in a simple, prior-art active-matrix organic light-emitting (OLED) display, each control element includes two transistors (a select transistor and a power transistor) and one capacitor for storing a charge specifying the luminance of the sub-pixel. Each light-emitting element typically employs an independent control electrode and a common electrode.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials. In flexible applications, the relatively large thin-film components are subject to considerable stress that modifies and degrades the performance of the thin-film components.

Matsumura et al describe crystalline silicon substrates used for driving LCD displays in US Patent Application No. 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown. The pixel control devices have a thickness of approximately 600 microns. Polishing techniques can be employed to reduce the thickness to approximately 200 microns. However, this thickness is still too large to effectively employ such pixel-control devices on a flexible substrate with a useful bending radius less than 2 cm.

Techniques for the reduction of stress in materials deposited on a substrate are described in "Theoretical and Experiment Studies of Bending of Inorganic Electronic Materials on Plastic Substrates" in Advanced Functional Materials 2008, 18, 2673-2684 by Park et al. This paper demonstrates that inorganic materials on flexible substrates have at least three failure modes: cracking, slipping, and delamination. The materials described and tested are not capable of controlling light-emitting elements in a display.

There is a need, therefore, for an improved flexible emissive device incorporating a chiplet.

SUMMARY OF THE INVENTION

In accordance with the invention, there is provided a flexible emissive display device, comprising:

a) a substrate having a display area;

b) an adhesion layer thinner than the substrate formed on the substrate surface;

c) a plurality of chiplets having a thickness greater than 2 microns and less than 200 microns adhered to the adhesion layer, each chiplet having at least one connection pad, the plurality of chiplets distributed within the display area, and wherein at least a portion of the adhesion layer extends above a portion of the chiplets;

d) a plurality of bottom electrodes formed over the adhesion layer in the display area, each bottom electrode electrically connected to a connection pad of one chiplet, whereby the chiplets provide current to each of the bottom electrodes;

e) at least one layer of material that is light-emitting formed over the bottom electrode;

f) a top electrode formed over the at least one layer of material, wherein the bottom electrodes, the at least one layer of material, and the top electrode together are thinner than the adhesion layer;

g) a cover thicker than the adhesion layer located over the top electrode and adhered to the substrate; and h) wherein the chiplets, bottom electrodes, at least one layer of material, and top electrodes are at or near the neutral stress plane of the structure formed by the layers a-g and the bending radius of the flexible emissive display device is less than 2 cm.

ADVANTAGES

The present invention provides an improved structure for a flexible light-emitting diode device with a reduced bending radius.

DETAILED DESCRIPTION OF THE INVENTION

Figure 1:
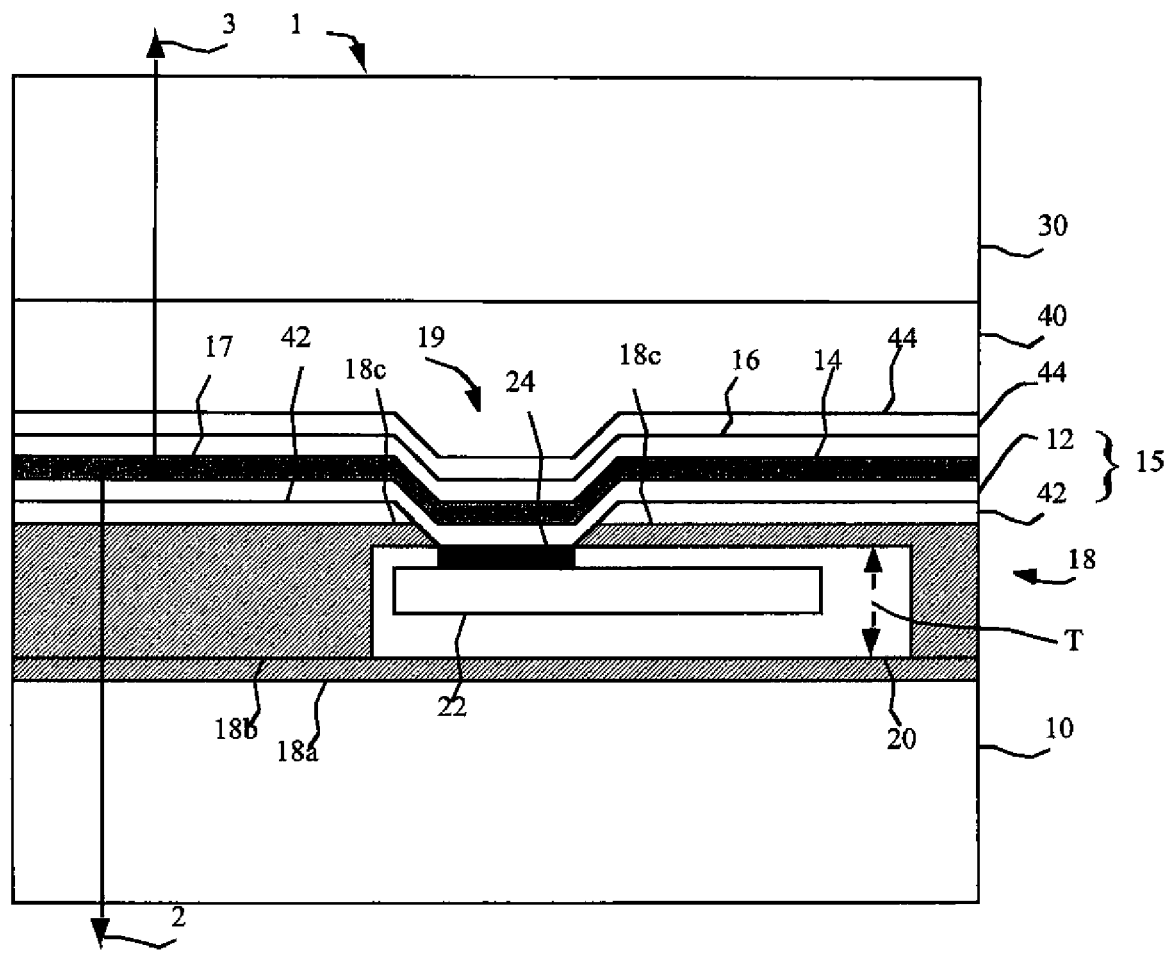
FIG. 1 is a partial cross-section of a device according to an embodiment of the present invention.
Figure 2:
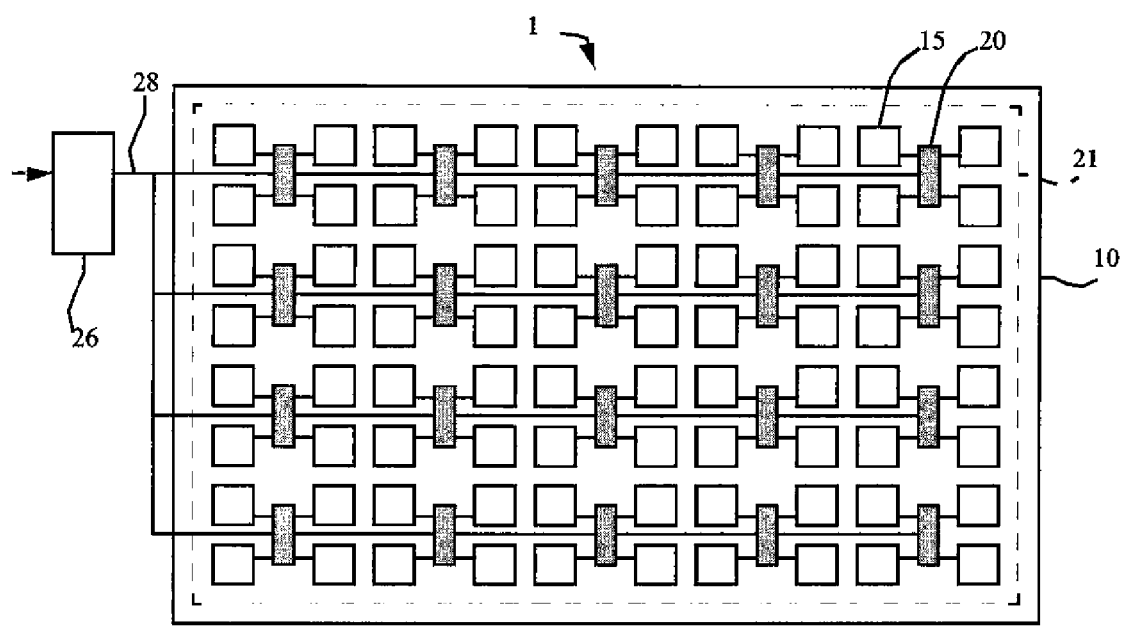
FIG. 2 is a plan view of a device according to an alternative embodiment of the present invention.

Referring to FIGS. 1 (in cross section) and 2 (in plan view), in one embodiment of the present invention, a flexible emissive display device 1 comprises a substrate 10 having a display area 21 and an adhesion layer 18 thinner than the substrate 10 formed on the substrate 10 surface. A plurality of chiplets 20 having a thickness T greater than 2 microns and less than 200 microns are adhered to the adhesion layer 18, each chiplet 20 having at least one connection pad 24, the plurality of chiplets 20 distributed within the display area 21, and at least a portion 18c of the adhesion layer 18 extends above the chiplets 20. A plurality of bottom electrodes 12 are formed over the adhesion layer 18 in the display area 21, each bottom electrode 12 is electrically connected to a connection pad 24 of one chiplet 20. At least one layer 14 of light-emitting material is formed over the bottom electrode 12 and a top electrode 16 is formed over the at least one layer 14 of light-emitting material. The electrodes 12, 16 and at least one layer 14 of light-emitting material form a light-emitting diode 15, for example an organic light-emitting diode (OLED), thinner than the adhesion layer 18. The chiplets 20 provide current through the connection pads 24 to the LED 15 bottom electrodes 12 to drive the at least one layer 14 of light-emitting material to emit light. The chiplets 20 can be controlled by an external controller 26 connected to the chiplets 20 by buss wires 28 (FIG. 2). The upper portion of the chiplets 20, the electrical connections from the connection pads 24 to the bottom electrode 12, and the LED 15 form the operating components of the flexible emissive display device 1.

A cover 30 thicker than the adhesion layer 18 is located over the top electrode 16 and adhered to the substrate 10. At least a portion of the chiplets 20, bottom electrodes 12, at least one layer 14 of light-emitting material, and top electrodes 16 are located at or near the neutral stress plane of the structure formed by the elements 10, 18, 20, 12, 14, 16, 30 and the bending radius of the flexible emissive display device 1 is less than 2 cm. The substrate and the cover can be flexible; as used herein the term "flexible" refers to having a bending radius equal to or less than 2 cm without cracking, delamination, or mechanical failure. A layer that is more flexible than another has a smaller elastic modulus than the other. The bottom electrodes 12 can be patterned to form individually controllable light-emitting diode pixels 15, illustrated in FIG. 2

In some embodiments of the invention, a buffer layer 40 can be employed between the top electrode 16 (and any layers formed over the top electrode 16). While the chiplet 20 can be up to 200 microns thick, preferably, the chiplets 20 are less than 50 microns thick, more preferably less than 20 microns thick, and most preferably less than 12 microns thick, for example 8-12 microns thick. The thinner chiplets provide greater flexibility. At the same time, however, the chiplets must have adequate thickness to construct integrated circuitry 22 within the chiplet 24.

The neutral stress plane is the plane within a stack of planar elements that does not experience stress when the element stack is flexed. The stack of planar elements are adhered across their adjacent surfaces. For example, a cover adhered to a substrate forms a stack of two planar elements. When the stack is bent so that the external surface of the cover forms a concave shape and the external surface of the substrate forms a convex shape (the top and bottom surfaces), the cover experiences a lateral compressive force orthogonal to the direction of the concave curve and the substrate experiences a lateral tensile force orthogonal to the direction of the convex curve. In other words, the cover is squeezed while the substrate is stretched. The compressive force is greatest at the external surface of the cover and diminishes to zero at points further from the external surface until the force becomes tensile and increases to the external surface of the substrate. The reverse occurs if the stack is bent in the opposite direction. The points within the element stack at which the force is zero form the neutral stress plane. Note that the neutral stress plane is not necessarily flat and its location will depend on other elements in the stack. Typically, however, the neutral stress plane will occupy the same location within the stack of planar elements, regardless of the direction or amount of flexure. The bending radius of the device is the minimum radius of curvature at which the device can be curved and continue to operate.

Encapsulating layers that prevent or reduce the transmission of water vapor into the LED 15 can be employed. For example, in one embodiment of the present invention, an encapsulating layer 42 can be formed over the adhesion layer 18 and beneath the bottom electrode 12. An encapsulating layer 44 can be formed over the top electrode 16 and beneath the buffer layer 40 (if present) and cover 30. Circuits 22 in the chiplets 20 can respond to external signals from a controller 26 provided through additional connection pads 24 to drive the LED 15 to emit light.

In an alternative embodiment, the encapsulation layers 42 and 44 can be attached directly onto the internal surfaces of the substrates 10 and 30 respectively.

The present invention can be employed in either a top- or bottom-emitter embodiment. In a bottom-emitter embodiment, the substrate 10 and bottom electrode 12 are transparent and light 2 is emitted through the substrate 10. In a top-emitter embodiment, the cover 30 and top electrode 12 are transparent and light 3 is emitted through the cover 30. In an alternative embodiment, the flexible emissive display device 1 is both top and bottom emitting. The cover 30 can be formed directly on the top electrode 16.

According to embodiments of the present invention, in order to provide a mechanically robust and flexible implementation, the substrate 10 and cover 30 are substantially thicker than the adhesion layer 18 and optional buffer layer 40. The adhesion layer 18 and optional buffer layer 40 are likewise substantially thicker than the electrodes 12, 16, and material layers 14. By substantially thicker is meant that the thickness is at least two times thicker and preferably five times thicker. In some embodiments, the term "substantially thicker" can mean ten times thicker or more. For example, in various embodiments of the present invention, the substrate 10 and cover 30 can be 100 microns thick, 200 microns thick, 500 microns thick, one mm thick or two mm thick. The adhesion layer 18 and buffer layer 40 can be two microns thick, ten microns thick, 20 microns thick, or 50 microns or more thick. The electrodes and light-emitting layers 12, 16, and 14, are typically less than two microns thick and preferably less than one micron thick.

The neutral stress plane is a theoretical plane within an adhered stack of layers, each layer having an individual stress factor. As described in Science vol. 320, 25 Apr. 2008, p. 507 by Kim et al (2008), the location of the neutral stress plane can be controlled by selecting materials and layer thicknesses.

The device thickness is considered to be the total flexible emissive display device 1 thickness, including the cover and substrate. The neutral stress plane is generally located at the center of a neutral zone and the neutral zone extends from either side of the neutral stress plane. The term "at or near the neutral stress plane" refers to the neutral zone and a layer that is "at or near the neutral stress plane" is within the neutral zone. The neutral zone has a total thickness that is the greater of either 20% of the device thickness or 200 microns. For example, a display that has a failure strain limits of $\epsilon<1\%$, comprises Si, the material on which integrated circuit chips are constructed having a strain limit of about $\epsilon=0.7\%$, must bend to a radius of curvature of R=10 mm. In general, for a very simple approximation the neutral zone thickness t of the device is defined as ($t=2\cdot\epsilon\cdot R$, where R is the maximum bending radius desired for the display. Therefore the example display has a neutral zone thickness t of 200 um ($t=2\cdot1\%\cdot10$ mm). In one embodiment of the present invention, the neutral stress plane is located where the top electrode 16 and the at least one layer 14 of material meet (element 17).

Inorganic elements on a flexible substrate are subject to failure from cracking, slipping, or delamination. By locating the chiplets 20 within the adhesive layer 18 with at least a portion 18c of the adhesion layer 18 extending above a portion of the chiplets 20, the problems of slipping and delamination are reduced. In particular, having the chiplets 20 within the adhesion layer 18 (i.e. 18b) reduces the problem of slipping so that the chiplets 20 cannot slide along the surface of the adhesion layer 18. Having a portion 18c of the adhesion layer extending above at least a portion of the chiplets 20, reduces the problem of delamination so that the chiplet 20 cannot be readily peeled from the adhesion layer 18. Cracking is reduced by locating at least a portion of the chiplets 20, preferably the upper portions (for example the connection pads 24) and more preferably the surface at or near the neutral stress plane. The upper surface of the chiplets 20 is of particular interest because the connection pads 24 and wiring connections are located there and it is desirable to minimize connection failures.

In one embodiment of the present invention, the flexible substrate 10 has a smaller elastic modulus than the adhesion layer 18. In another embodiment of the present invention, the cover 30 has a smaller elastic modulus than the buffer layer 40. In yet another embodiment of the present invention, the adhesion layer 18 has a smaller elastic modulus than the chiplet 20. By requiring that the substrate 10 and cover 30 have a smaller elastic modulus than the adhesion layer 18 and optional buffer layer 40, stress is reduced in the adhesion and optional buffer layers 18, 40 respectively. By requiring that the adhesion layer 18 has a smaller elastic modulus than the chiplets 20 and, in turn, the substrate 10 has a smaller elastic modulus than the adhesion layer 18, stress and cracking, as well as slipping and delamination, are reduced in the chiplet 20. Since the chiplet 20 is a critical element in controlling the light emitter, reducing the stress in the chiplet 20 (and connections to the chiplet) will improve the performance of the flexible emissive display device 1 under stress. Likewise, by requiring that the optional buffer layer 40 have a smaller elastic modulus than the cover 30, the stress is reduced in the thin electrodes 12, 16 and one or more material layers 14. Since failure in these layers can cause failure in pixels or in the entire flexible emissive display device 1, reducing the stress in the buffer layer 40 will improve the performance of the flexible emissive display device 1 under stress.

Stress modeling of the structures shown in FIG. 1 demonstrates that OLED devices having the structure illustrated can bend to a smaller radius of curvature without exceeding a given critical strain limit within the neutral zone.

In embodiments of the present invention, encapsulation layers are formed beneath or above, or both, the one or more material layers 14. As is known, organic light emitting materials are deleteriously affected by moisture. Therefore, the use of encapsulation layers that reduce the transmission rate of water moisture into the one or more light-emitting layers 14 improves the lifetime of the device. Such encapsulation layers are typically inorganic thin films and very brittle. These encapsulation layers are frequently employed in substrates 10 and covers 30. However, the substrates 10 and covers 30 are, according to embodiments of the present invention, subject to the greatest stress when the flexible emissive display device 1 is flexed and therefore any inorganic material layers in the substrates 10 and covers 30 are more likely to fail. Hence, according to an embodiment of the present invention, inorganic encapsulation layers are provided over the adhesion layer 18 or over the top electrode 16 as illustrated with encapsulation layers 42 and 44, respectively. In these locations, the encapsulation layers experience less stress and therefore are more likely to survive flexing stress. The encapsulation layer 42 located over the adhesion layer 18 can be provided by sputtering, chemical vapor deposition (CVD) or atomic layer deposition (ALD). Sputtering inorganic materials (such as silicon dioxide) provides some protection while chemical vapor deposition provides improved performance. However, atomic layer deposition provides the best protection against moisture transmission. Once formed in a layer, the encapsulation layer 42, can be patterned by photolithographic techniques to form vias 19 through which the bottom electrode can be connected to a chiplet connection pad 24.

According to an embodiment of the present invention, one or more layers of wires 28 connected to chiplet connection pads 24 to provide signals to the chiplets from an external controller 26 (for example, power, ground, data, and select signals) are formed over the adhesion layer 18. In a preferred embodiment, a single layer of wires 28 is employed. Since the conductivity of the wires 28 can be affected by stress, providing the wires 28 above the adhesion layer 18 reduces the stress experienced by the wires when the flexible emissive display device 1 is flexed. The optional encapsulation layer 42 can be formed over the wires 28.

The chiplets 20 are essentially buried within the adhesion layer 18 to reduce the stress on the chiplets 20. However, the chiplets 20 are also adhered to the flexible substrate 10 as a part of the manufacturing process. Hence a first layer 18a of adhesive can be used to adhere the chiplets 20 to the flexible substrate 10 and then a second layer 18b provided to embed the chiplet 20 into the adhesion layer 18. A portion 18c of the adhesion layer 18 is located over at least a portion of the chiplets 20.

At least a portion of the chiplet 20, for example the surface on which the connection pad 24 is located, the optional encapsulation layer 42, the bottom electrode 12, the at least one layer 14 of light-emitting material, the top electrode 16, and the optional encapsulation layer 44 can be located at or near the neutral stress plane of the flexible emissive display device 1 by carefully selecting and matching the material and thicknesses of the flexible substrate 10, the adhesion layer 18, the optional buffer layer 40, and the flexible cover 30. In one simple embodiment, the flexible cover and substrate 30, 10 comprise identical or the same materials and are each five times thicker than the adhesion layer 18 and buffer layer 40. For example the cover 30 and substrate 10 can be 100 microns thick each while the adhesion layer 18 and buffer layer 40 are 20 microns thick each. The chiplets 20 can be 5-18 microns thick and the LED 15 less than 2 microns thick. Hence the chiplets 20 and LED 15 are less than 20 microns thick while the remainder of the structure is 240 microns thick. Hence, the inorganic elements of the flexible emissive display device 1 for which performance is most critical are less than one tenth of the thickness of the flexible emissive display device 1 itself. Therefore, the critical inorganic elements can be subjected to greatly reduced stress when the flexible emissive display device 1 is stressed, for example by rolling.

In one embodiment of the present invention, the flexible substrate 10 and cover 30 comprise similar or the same materials, for example a polymer such as PET or PEN. By comprising the "similar or the same materials" is meant that the layers include materials of the same type and have similar mechanical characteristics. Additional inorganic layers can also be provided to reduce the water vapor transmission rate through the materials that increase the stiffness of the substrate 10 and cover 30. By employing a curable polymer (for example benzocyclobutene, for the adhesion layer 18, and a similar material for a buffer layer 40, together with a chiplet having a thickness less than 20 microns, a flexible emissive display device 1 can be made that has a bending radius of less than 2 cm. In this embodiment, the substrate 10 and the cover 30 can have the same thickness and the adhesion layer 18 and the buffer layer 40 can have the same thickness. By "having the same thickness" is meant that the layers have a thickness within 10% of the same value.

One such device can be constructed by employing a clean 200-micron thick PET substrate. Over the substrate can be optionally deposited using ALD or CVD a thin (less than 1 micron) layer of aluminum oxide, silicon dioxide, or zinc oxide. A two-micron layer of benzocyclobutene (BCB) can be deposited; an array of chiplets printed onto the BCB; and a 20-micron lower layer of BCB can be deposited over the first layer and chiplets. A thin, less than one micron thick, optional inorganic coating of aluminum oxide, silicon dioxide, or zinc oxide can be deposited on the BCB. Using photolithographic methods, vias can be opened in the BCB and optional oxide coating to expose the connection pads on top of the chiplet. The wiring layer that connects to connection pads on the chiplets to form an active-matrix control system can be formed by depositing metal over the surface, either BCB layer or the optional oxide, and patterning the wires using standard photolithographic methods. A thin (about 1 micron) planarization layer can be coated over the wires. Photolithographic methods can then be used to open vias to the wires and ITO deposited and patterned to form a transparent electrode. Organic materials and a reflective metal electrode can be deposited to form an OLED structure. A third, optional inorganic coating of aluminum oxide, silicon dioxide, or zinc oxide can be applied, followed by a 22-micron upper layer of BCB over the top electrode and inorganic layer (if present). A PET cover of 200 microns thickness can then be adhered to the PET substrate. The PET cover can optionally have a thin (less than 1 micron) layer of aluminum oxide, silicon dioxide, or zinc oxide on the side towards the OLED that is deposited using ALD or CVD. The thicknesses of the substrate and cover should be matched, as should the lower and upper BCB layer thicknesses. In alternative embodiments, the PET cover and substrate can comprise other common materials and have other common thicknesses. In particular, the substrate and cover material can comprise a commercially-available multi-layer moisture resistant material. Alternative material having similarly useful adhesion, curability, and transparency as BCB can be employed, as long as the layer thicknesses are matched. Because the cover and substrate are matched in material and thickness, and because the upper and lower BCB layers are matched in material and thickness, the neutral zone will include the tops of the chiplets, the wiring layer, electrodes, and organic layers, as well as the second and third inorganic layers, if present.

In a further embodiment of the present invention, one of either the substrate 10 or cover 30 can be a metal film, for example stainless steel. Metal films are known to be impermeable to the transmission of water and are also opaque. Therefore, if a metal film is employed, for example as a substrate 10, the cover 30 must comprise a different, transparent material. In this case, the structure of the flexible emissive display device is not symmetric about the operating components. Hence, the thickness of the substrate 10 and cover 30 may not be the same, since their elasticity moduli are different, and the location of the neutral stress plane is therefore not halfway between the outer surfaces of the substrate 10 and cover 30. Likewise, the materials used in the adhesion layer 18 and the buffer layer 40 can be different, and hence the thickness of the two layers can be different. Moreover, the thickness of either the buffer layer 40 or the adhesion layer 18 can be adjusted to compensate for differences in material or thickness of the substrate 10 and cover 30 and located at or near the neutral stress plane of the flexible emissive display device 1 at or near the location of the operating components. It is also possible, in other embodiments, for the location of the neutral stress plane to vary. In such cases, the thickness of the buffer layer 40 or the adhesion layer 18 vary in compensation.

An asymmetric device can be constructed by employing a 50-micron thick metal foil substrate. A two-micron layer of benzocyclobutene (BCB) is deposited, an array of chiplets can be printed onto the BCB, and a 20-micron lower layer of BCB can be deposited over the first layer and chiplets. Using photolithographic methods, vias can be opened in the BCB to expose the connection pads on top of the chiplet. The wiring layer that connects to connection pads on the chiplets to form an active-matrix control system can be formed by depositing metal over the surface, either BCB layer, and patterning the wires using standard photolithographic methods. A thin (about 1 micron) planarization layer can be coated over the wires. Photolithographic methods can then be used to open vias to the wires and ITO deposited and patterned to form a transparent electrode. Organic materials and a reflective metal electrode can be deposited to form an OLED structure. An optional inorganic coating of aluminum oxide, silicon dioxide, or zinc oxide can be applied, followed by a 30-micron upper layer of lower-modulus adhesive over the top electrode and inorganic layer (if present). A PET cover of approximately 275 microns thickness can then be adhered to the metal substrate. The PET cover can optionally have a thin (less than 1 micron) layer of aluminum oxide, silicon dioxide, or zinc oxide on the side towards the OLED that is deposited using ALD or CVD. In alternative embodiments, the PET cover and metal substrate can comprise other common materials and have other common thicknesses. In particular, the substrate and cover material can comprise a commercially-available multi-layer moisture resistant material. Alternative material having similarly useful adhesion, curability, and transparency as BCB can be employed.

While, in this example, the cover and substrate are not matched in material and thickness, the materials and thicknesses are chosen so that the neutral zone will include the tops of the chiplets, the wiring layer, electrodes, and organic layers, as well as the second and third inorganic layers, if present. In a multilayer stack with n layers, with the first layer on top, the location of the neutral zone is given by:

$$b = \frac{\sum_{i=1}^{n} E_i h_i \left[ \left( \sum_{j=1}^{i} h_j \right) - \frac{h_i}{2} \right]}{\sum_{i=1}^{n} E_i h_i} \quad (1)$$

where the location of the neutral zone b is measured from the top of the stack and the $i^{th}$ layer has height $h_i$ and modulus $E_i$. Stainless steel has an elastic modulus of approximately 78 GPa while the PET encapsulating cover has an elastic modulus of approximately 4 GPa. BCB has an elastic modulus of approximately 4 GPa while the lower-modulus adhesive has an elastic modulus of 1 GPa. Therefore, in order to locate the center of the neutral zone approximately between the BCB and upper adhesive layers, a thickness of 275 um is required for the PET encapsulating cover, as defined by Equation (1).

Figure 3:
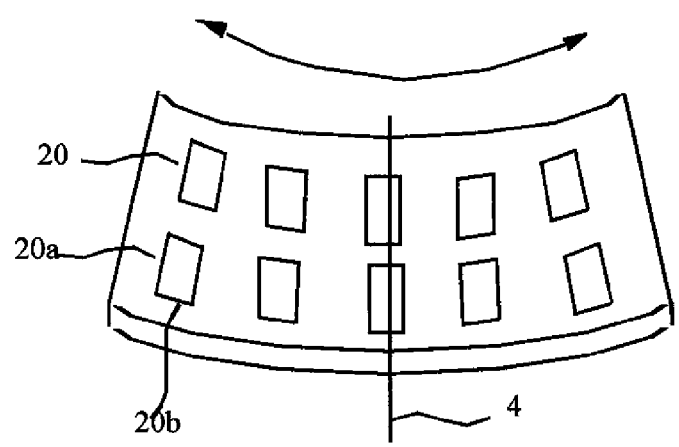
FIG. 3 is a three-dimensional view of a curved device according to an embodiment of the present invention.

In a further embodiment of the present invention (see FIG. 3), the chiplets 20 have a relatively long side 20a and a relatively short side 20b and the flexible emissive display device 1 has a preferred axis 4 about which it is rolled like a scroll. According to this embodiment, the longer side 20a of the chiplets are aligned with the preferred flexible device axis 4.

In either a top-emitter or a bottom-emitter configuration, an optional color filter can be employed to filter the light emitted by the at least one layer 14 of light-emitting material. A color filter can be formed between at least a portion of the substrate 10 and the bottom electrode 12. The color filter can be formed directly on a portion of the substrate 10 or on portions of other layers formed over the substrate 10. In a top-emitter embodiment, a color filter can be located on a cover or directly on the top electrode. In a display device, multiple color filters can be employed with multiple chiplets and multiple, independently controlled, bottom electrodes 12 to make multiple pixel elements having differently colored sub-pixels. The color filters are especially useful in the case in which the light-emitting materials are not patterned over the substrate. Alternatively, different light-emitting materials can be patterned over the substrate in correspondence with the bottom electrode, each light-emitting material emitting a different color of light, to form a multi-colored display.

Today a large-volume manufacturing infrastructure exists to make and sell "color-filter glass" for the LCD industry. These products include patterned color filters on glass, covered with a patterned transparent conductor—usually ITO. A low-cost embodiment of the current invention starts with this color-filter glass and patterned lower electrode as the substrate 10 for the emissive device, providing that the base material on which these elements were deposited had adequate flexibility for the desired display application.

According to a method of the present invention, a flexible emissive display device can be made by the steps of providing a substrate having a display area, forming an adhesion layer thinner than the substrate on the substrate surface, adhering a plurality of chiplets having a thickness greater than 2 microns and less than 200 microns to the adhesion layer, each chiplet having one or more connection pads, the plurality of chiplets distributed within the display area, and wherein at least a portion of the adhesion layer extends above the chiplets, forming a plurality of bottom electrodes over the adhesion layer in the display area, each bottom electrode electrically connected to a connection pad of one chiplet, whereby the chiplets provides current to each of the bottom electrodes, forming at least one layer of light-emitting material over the bottom electrode, forming a top electrode over the one or more layers of material, wherein the electrodes and at least one layer of light-emitting material are together thinner than the adhesion layer, locating a cover thicker than the adhesion layer over the top electrode and adhering it to the substrate, and wherein the chiplets, bottom electrodes, one or more layers of material, and top electrodes are at or near the neutral stress plane of the structure formed by the layers a-g and the bending radius of the flexible emissive display device is less than 2 cm.

In various embodiments of the present invention, the bottom electrode can be formed in a common step with wires, thereby reducing manufacturing costs. One or more busses can be formed over the substrate and the busses formed in a common step with the bottom electrode or the busses can be formed in a common step with the wires. A buss-insulating layer can be formed between the one or more busses and the bottom electrode. A chiplet-insulating layer can be formed over the chiplet and connection pads and beneath the one or more light-emitting layers or the top electrode. The buss-insulating layer can be formed in a common step with the chiplet-insulating layer. By forming elements of the present invention in common steps, processing steps and costs are reduced. Likewise the electrical conductor formed between the connection pad on the chiplet and the bottom electrode can be formed either before the bottom electrode, after the bottom electrode, or most desirably, in the same step as the bottom electrode in order to reduce processing steps and cost.

The substrate 10 can comprise flexible glass. Wires and top or bottom electrodes 16, 12, can be made of evaporated or sputtered metal, e.g. aluminum, silver, or a metal alloy. The chiplet 20 can be formed using conventional techniques well established in the integrated circuit industry and located over the substrate 10 using methods described in co-pending, commonly assigned, U.S. application Ser. No. 12/191,478.

Chiplets are separately manufactured from the display substrate and then applied to the display substrate. The chiplets are preferably manufactured using silicon or silicon on insulator (SOI) wafers using known processes for fabricating semiconductor devices. Each chiplet is then separated prior to attachment to the flexible substrate. The crystalline base of each chiplet can therefore be considered a substrate separate from the flexible substrate and over which the chiplet's circuitry is disposed. In particular, the independent substrate is separate from the substrate 10 on which the pixels are formed and the areas of the independent, chiplet substrates for a multi-chiplet device, taken together, are smaller than the flexible substrate 10. Chiplets can have a crystalline substrate to provide higher performance active components than are found in, for example, thin-film amorphous or polycrystalline silicon devices. Chiplets can have a thickness preferably of 100 µm or less, and more preferably 20 µm or less. This facilitates formation of a portion 18c the adhesion layer 18 over a portion of the chiplet.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. Therefore, the circuitry of the chiplet for driving the pixels, such as the two transistors for each pixel, can be made small. The chiplet, however, also requires connection pads for making electrical connection to the wiring layer provided over the chiplets once assembled onto the display substrate. The connection pads must be sized based on the feature size of the lithography tools used on the display substrate (for example 5 μm) and the alignment of the chiplets to the wiring layer (for example +/−5 μm). Therefore, the connection pads can be, for example, 15 μm wide with 5 μm spaces between the pads. This means that the pads will generally be significantly larger than the transistor circuitry formed in the chiplet.

The connection pads 24 can generally be formed in a metallization layer on the chiplet 20 over the transistors. It is desirable to make the chiplet with as small a surface area as possible to enable a low manufacturing cost. Therefore, the size and number of the connection pads and not the transistors will generally limit the size of the chiplet.

The present invention can be employed in devices having a multi-pixel or multi-chiplet infrastructure and can be employed in either an active-matrix configuration in which the chiplet has circuitry that controls each pixel as an active-matrix element or as a passive-matrix controller. The present invention provides advantages when decreased costs and improved performance are important. In particular, the present invention can be practiced with active-matrix LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to Van Slyke et al. Inorganic devices, for example, employing quantum dots formed in a polycrystalline semiconductor matrix (for example, as taught in US Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top-emitter architecture or bottom-emitter architecture.

The invention has been described in detail with particular reference to certain preferred embodiments thereof, but it should be understood that variations and modifications could be effected within the spirit and scope of the invention.

PARTS LIST

T chiplet thickness
1 flexible emissive display device
2,3 light rays
4 preferred axis
10 flexible substrate
12 bottom electrode
14 light-emitting layer(s)
15 light-emitting diode
16 top electrode
17 interface element
18 adhesion layer
18a adhesion layer portions
18b adhesion layer portions
18c adhesion layer portions
19 via
20 chiplet
20a chiplet long side
20b chiplet short side
21 display area
22 circuitry
24 connection pad
26 controller
28 wires
30 flexible cover
40 buffer layer
42 encapsulation layer
44 encapsulation layer

What is claimed is:

1. A flexible emissive display device, comprising:
 a) a substrate having a display area;
 b) an adhesion layer thinner than the substrate formed on the substrate surface;
 c) a plurality of chiplets having a thickness greater than 2 microns and less than 200 microns adhered to the adhesion layer, each chiplet having at least one connection pad, the plurality of chiplets distributed within the display area, and wherein at least a portion of the adhesion layer extends above a portion of the chiplets;
 d) a plurality of bottom electrodes formed over the adhesion layer in the display area, each bottom electrode electrically connected to a connection pad of one chiplet, whereby the chiplets provide current to each of the bottom electrodes;
 e) at least one layer of light-emitting material formed over the bottom electrode;
 f) a top electrode formed over the at least one layer of light-emitting material, wherein the bottom electrodes, the at least one layer of material, and the top electrode together are thinner than the adhesion layer;
 g) a cover thicker than the adhesion layer located over the top electrode and adhered to the substrate; and
 h) wherein the chiplets, bottom electrodes, at least one layer of light-emitting material, and top electrodes are at or near the neutral stress plane of the structure formed by the layers a-g and the bending radius of the flexible emissive display device is less than 2 cm.

2. The flexible emissive display device of claim 1, wherein the substrate and the cover comprise the same material.

3. The flexible emissive display device of claim 1, wherein the substrate and the cover have the same thickness.

4. The flexible emissive display device of claim 1, wherein the substrate and the cover comprise different material.

5. The flexible emissive display device of claim 4, wherein the substrate and the cover have a different thickness.

6. The flexible emissive display device of claim 1, further comprising a buffer layer located between the top electrode and the cover.

7. The flexible emissive display device of claim 6, wherein the buffer layer and the adhesion layer comprise the same material.

8. The flexible emissive display device of claim 6, wherein the buffer layer and the adhesion layer have the same thickness.

9. The flexible emissive display device of claim 6, wherein the buffer layer is less flexible than the cover.

10. The flexible emissive display device of claim 6, wherein the buffer layer and the adhesion layer comprise different material.

11. The flexible emissive display device of claim 10, wherein the buffer layer and the adhesion layer have a different thickness.

12. The flexible emissive display device of claim 6, wherein the buffer layer has a thickness between 2 and 50 microns.

13. The flexible emissive display device of claim 1, wherein the adhesion layer is less flexible than the substrate.

14. The flexible emissive display device of claim 1, further comprising an encapsulation layer formed over or within the adhesion layer.

15. The flexible emissive display device of claim 1, further comprising an encapsulation layer formed over the chiplets and the adhesion layer.

16. The flexible emissive display device of claim 1, further comprising an encapsulation layer formed over a wire connected to the connection pads.

17. The flexible emissive display device of claim 1, wherein the adhesion layer has thickness of 2-50 microns.

18. The flexible emissive display device of claim 1, wherein the substrate has a thickness of 50-500 microns or wherein the cover has a thickness of 50-500 microns.

19. The flexible emissive display device of claim 1, wherein the neutral stress plane is located where the top electrode and the one or more layers of material meet.

20. The flexible emissive display device of claim 1, further comprising a wiring layer formed over the adhesion layer.

* * * * *